(12) United States Patent
Kao

(10) Patent No.: US 9,246,066 B1
(45) Date of Patent: Jan. 26, 2016

(54) FLUORESCENT COMPOSITE RESIN SUBSTRATE WHITE LIGHT LIGHT EMITTING DIODE

(71) Applicant: Yu-Yu Kao, Taipei (TW)

(72) Inventor: Yu-Yu Kao, Taipei (TW)

( * ) Notice: Subject to any disclaimer, the term of this patent is extended or adjusted under 35 U.S.C. 154(b) by 0 days.

(21) Appl. No.: 14/694,899

(22) Filed: Apr. 23, 2015

(30) Foreign Application Priority Data

Jul. 30, 2014 (TW) .............................. 103213446 U

(51) Int. Cl.
*H01L 27/15* (2006.01)
*H01L 33/50* (2010.01)
*H01L 33/62* (2010.01)
*H01L 33/48* (2010.01)

(52) U.S. Cl.
CPC ............ *H01L 33/502* (2013.01); *H01L 33/486* (2013.01); *H01L 33/62* (2013.01)

(58) Field of Classification Search
None
See application file for complete search history.

(56) References Cited

U.S. PATENT DOCUMENTS 8,648,370 B2 * 2/2014 Liu ........................ H01L 33/505
257/100

* cited by examiner

*Primary Examiner* — Jack Chen
(74) *Attorney, Agent, or Firm* — Muncy, Geissler, Olds & Lowe, P.C.

(57) ABSTRACT

A fluorescent composite resin substrate white light LED includes a fluorescent composite resin substrate, two conductive brackets, a light emitting unit, two conductive lines and a package material. The fluorescent composite resin substrate is formed from a mixture through a curing reaction. Each of the conductive brackets is partially connected to the substrate. The light emitting unit is disposed on the substrate. The conductive lines are connected to the light emitting unit and respectively connected to the conductive brackets. The package material is formed from a mixture through a curing reaction. By fixing the light emitting unit at the fluorescent composite resin substrate, when applied to white light LED operations, the present invention achieves effects of emitting light through six planes, having high light flux and good heat dissipation, and significantly increasing production yield rate and speed without incurring different color temperatures at front and reverse sides.

8 Claims, 5 Drawing Sheets

FLUORESCENT COMPOSITE RESIN SUBSTRATE WHITE LIGHT LIGHT EMITTING DIODE

BACKGROUND OF THE INVENTION a) Field of the Invention

The invention relates in general to a fluorescent composite resin substrate white light light emitting diode (LED), and more particularly, to an LED substrate applied to a white light LED. The device utilizes a light emitting unit fixed on the fluorescent composite resin substrate to achieve effects of emitting light from six planes as well as having high light flux and good heat dissipation.

b) Description of the Prior Art

For many years, in a conventional light emitting diode (LED) chip-on-board (COB) technology, a light emitting element is mainly directly fixed on a substrate (aluminum, PCB (Printed Circuit Board) or ceramic). However, the above LED COB technology suffers from drawbacks of being capable of emitting light through only one single plane and having low light flux that cannot be effectively enhanced.

In view of the above drawbacks, a chip-on-glass (COG) technology is later developed. In the COG technology, a light emitting element is directly fixed on a glass substrate. Thus, the COG technology features emitting light through six planes and has high light flux.

However, the COG technology has following drawbacks.

1. Compared to conventional substrates (aluminum, PCB and ceramic), the glass substrate has poorer heat dissipation efficiency.

2. Compared to the COB technology, in the manufacturing process of the COG technology, the COG glass substrate is easily broken, resulting in a yield rate of only 60%. Further, the COG technology has a slow manufacturing process.

3. As the glass substrate contains no fluorescent powder whereas a package adhesive contains fluorescent powder, color temperatures at a front side and a reverse side when the chip emits light are different.

Therefore, there is a need for a solution that improves inadequate effects and practicability of the conventional COB and COG technologies.

SUMMARY OF THE INVENTION

In view of the drawbacks of the conventional technologies, it is a primary object of the present invention to provide a fluorescent composite resin substrate white light light emitting diode (LED) capable of emitting light through six planes as well as having high light flux and good heat dissipation.

It is another object of the present invention to provide a fluorescent composite resin substrate white light LED having a manufacturing process capable of significantly increasing yield rate and speed.

It is another object of the present invention to provide a fluorescent composite resin substrate white light LED that is free from different color temperatures at front and reverse sides.

To achieve the above and other objects, the present invention provides a fluorescent composite resin substrate white light LED applicable to a white light LED.

More particularly, the fluorescent composite resin substrate white light LED of the present invention is applicable to an LED substrate of a white light LED.

A fluorescent composite resin substrate white light LED of the present invention includes: a fluorescent composite resin substrate, formed from a mixture through a curing reaction; two conductive brackets, each being partially connected to the substrate; a light emitting unit, disposed on a surface of the substrate; two conductive lines, connected to the light emitting unit and respective connected to the conductive brackets; and a package material, formed from a mixture through a curing reaction.

The mixture forming the fluorescent composite resin substrate may include curable composite resin, a hardening agent and a fluorescent material.

The curable composite resin is a combination of resin and a glass filler.

For example, the resin in the curable composite resin is selected from a group consisting of epoxy, bisphenol A epoxy, cycloaliphatic epoxy, siloxane modified epoxy resin, acrylic modified epoxy resin, other organic modified epoxy resin, silicone, silicone gel, silicone rubber, silicone resin, and organic modified silicone resin.

The glass filler in the curable composite resin is selected from a group consisting of common glass ($SiO_2$) and sapphire glass ($Al_2O_3$), and is presented in form of glass powder, nanoscale glass powder, nanoscale sapphire glass powder, glass balls, glass films, glass fiber, glass fiber cloth, sapphire glass powder, sapphire glass balls or sapphire glass fiber, powder reformed from a main body of $SiO_2$, or powder reformed from a main body of $Al_2O_3$.

The hardening agent is selected from a group consisting of a hardening agent of acid anhydride, an initiator, phenolic resin and a platinum based catalyst.

The fluorescent material is mainly a yellow fluorescent material, and may further include other red, green or orange fluorescent material that assists in adjusting color temperature and rendering.

The fluorescent material is selected from a group consisting of aluminate, silicate, nitride and oxynitride fluorescent materials.

Each of the conductive brackets is partially embedded in the substrate.

The light emitting unit is a light emitting unit in form of a blue light LED die or a violet light LED die that emits a wavelength of below 500 nm.

The package material covers on the conductive lines and the light emitting unit.

In the fluorescent composite resin substrate white light LED of the present invention, the light emitting unit is fixed at the fluorescent composite resin substrate. Thus, when the present invention is applied in white light LED operations, as the light emitting unit is capable of simultaneously generating light through six planes including front, reverse and four lateral sides, light flux is naturally higher than that of the COB technology. Further, with the fluorescent powder included in the fluorescent composite resin substrate, a reverse light source of the chip is allowed to directly impact the fluorescent powder to emit white light. Thus, not only light flux is similarly greater than that of the COG technology, but also the issue of different color temperatures at front and reverse sides is eliminated. Further, on the account of the fluorescent powder in the fluorescent composite resin substrate and a design of polygonal or circular holes at the bottom, heat dissipation of the fluorescent composite resin substrate is much more effective than that of a glass substrate, and is close to that of a conventional PCB or aluminum substrate. Further, as the fluorescent composite resin includes a glass material, the fluorescent composite resin has rigidity similar to that of glass while being less brittle than pure glass, thereby providing both rigidity and resilience to hugely increase the production yield rate and speed.

DETAILED DESCRIPTION OF THE PREFERRED EMBODIMENTS

Details of preferred but non-limiting embodiments of the present invention are given below. One person having ordinary skill in the art can understand other advantages and effects of the present invention based on the disclosure of the application. The present invention may be implemented and applied through other embodiments. It should be noted that, without departing the spirit of the present invention, modifications and variations may be made to details disclosed in the application based on different aspects and applications.

Figure 1:
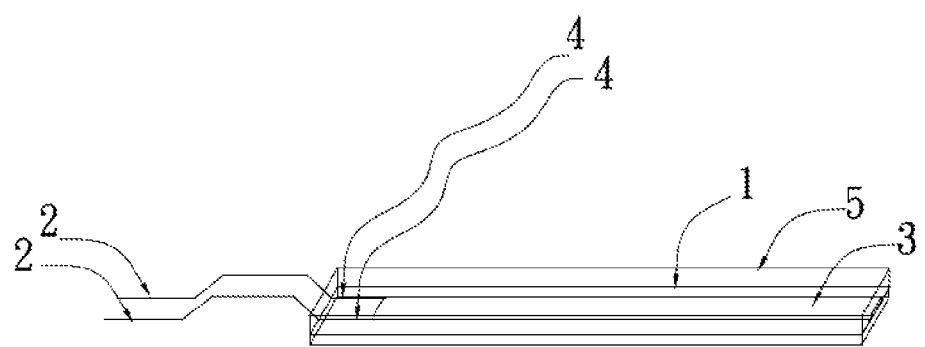
FIG. 1 is a perspective view of an appearance of the present invention.
Figure 2:
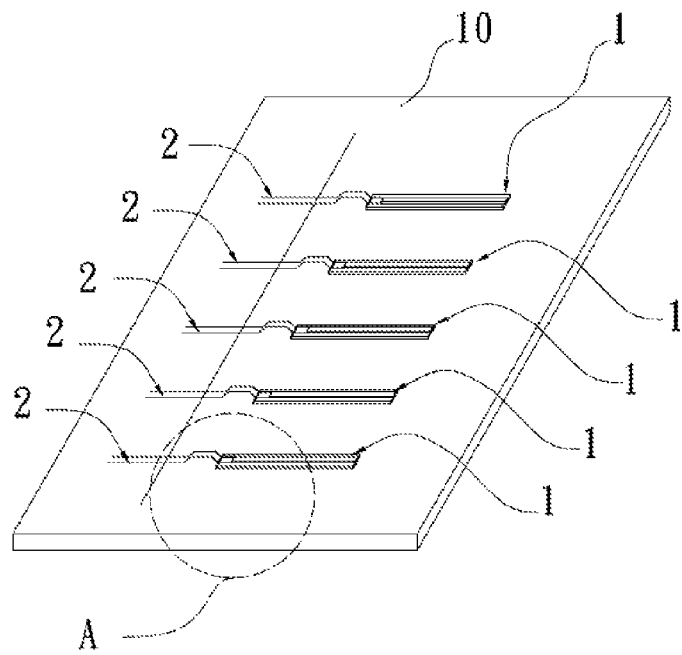
FIG. 2 is a perspective view of an appearance of the present invention before being manufactured.
Figure 2A:
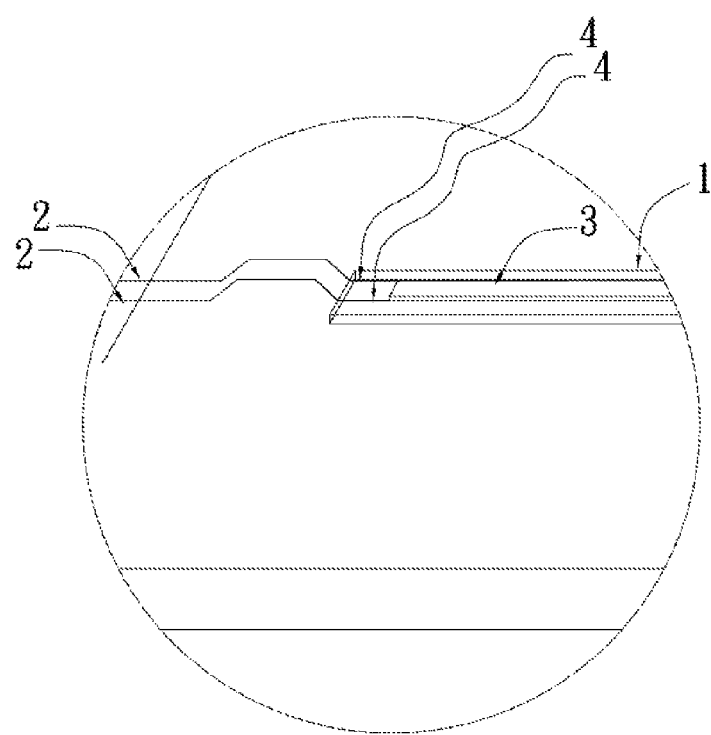
FIG. 2A is an enlarged partial elevational view of an appearance of the present invention before being manufactured.
Figure 3:
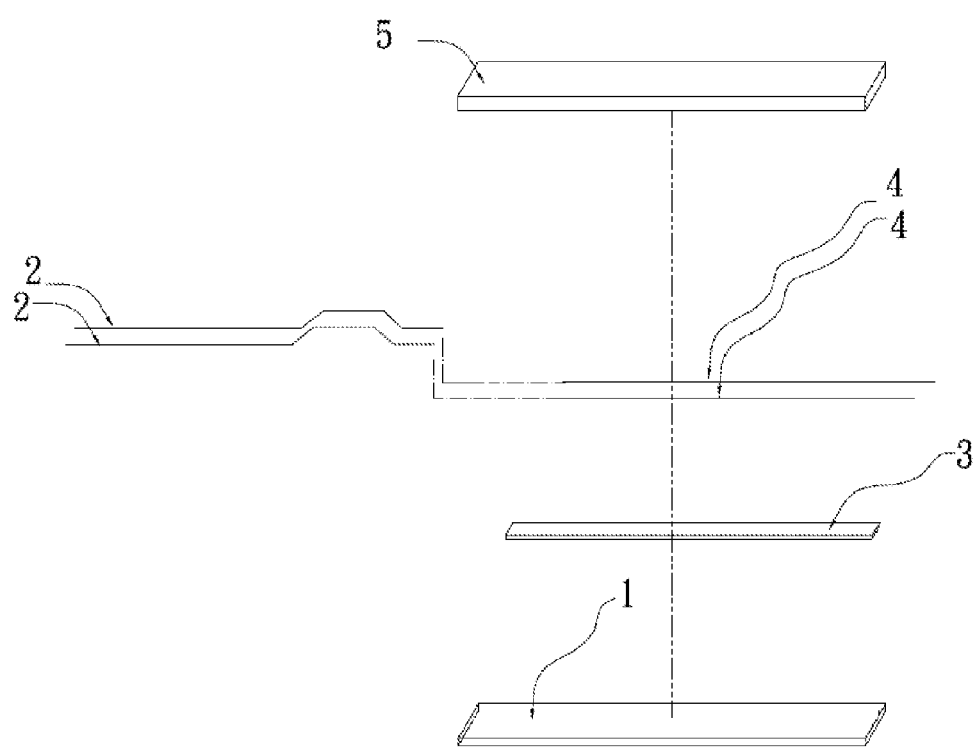
FIG. 3 is an enlarged partial exploded view of an appearance when manufacturing the present invention.
Figure 4:
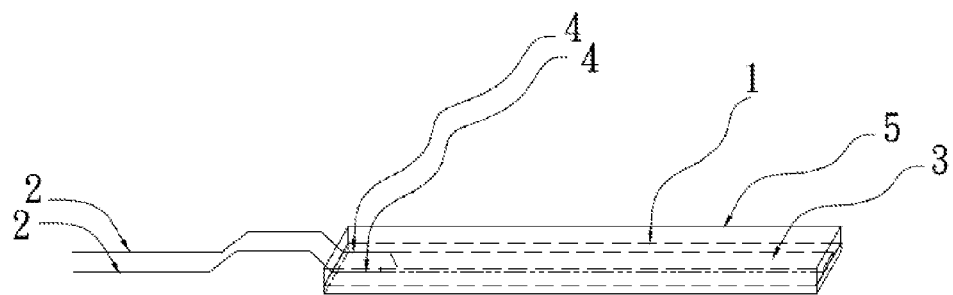
FIG. 4 is an elevational view of an appearance of an assembly of the present invention.

Referring to FIG. 1 and the other drawings, the fluorescent composite resin substrate white light light emitting diode (LED) of the present invention includes a fluorescent composite resin substrate 1, two conductive brackets 2, a light emitting unit 3, two conductive lines 4 and a package material 5.

The fluorescent composite resin substrate 1 is formed from a mixture through a curing reaction. The mixture forming the fluorescent composite resin substrate may include curable composite resin, a hardening agent and a fluorescent material.

The curable composite resin is a combination of resin and a glass filler.

For example, the resin in the curable composite resin is selected from a group consisting of epoxy, bisphenol A epoxy, cycloaliphatic epoxy, siloxane modified epoxy resin, acrylic modified epoxy resins, other organic modified epoxy resin, silicone, silicone gel, silicone rubber, silicone resin, and organic modified silicone resin.

The glass filler in the curable composite resin is selected from a group consisting of common glass (SiO2) and sapphire glass (Al2O3), and is presented in form of glass powder, nanoscale glass powder, nanoscale sapphire glass powder, glass balls, glass films, glass fiber, glass fiber cloth, sapphire glass powder, sapphire glass balls or sapphire glass fiber, powder reformed from a main body of SiO2, or powder reformed from a main body of Al2O3.

The hardening agent is selected from a group consisting of a hardening agent of acid anhydride, an initiator, phenolic resin and a platinum based catalyst.

Each of the two conductive brackets 2 is partially connected to the fluorescent composite resin substrate 1, with the partially connected parts embedded in the fluorescent composite resin substrate 1.

The light emitting unit 3 is disposed on a surface of the fluorescent composite resin substrate 1, and is a light emitting unit in form of a blue light LED die or a violet light LED die that emits a wavelength of below 500 nm.

The two conductive lines 4 are connected to the light emitting unit 3 and then respectively connected to the conductive brackets 2.

The package material 5 is formed from a mixture through a curing reaction. The mixture forming the package material 5 may include curable resin, a hardening agent and a fluorescent material. The package material 5 covers and seals the conductive lines 4 and the light emitting unit 3 to form a finished product of a fluorescent composite resin substrate white light LED.

The fluorescent material is mainly a yellow fluorescent material, and may further include other red, green or orange fluorescent material that assists in adjusting color temperature and rendering.

The fluorescent material is selected from a group consisting of aluminate, silicate, nitride or oxynitride fluorescent materials.

For example, the curable resin in the mixture of the package material is selected from a group consisting of epoxy, bisphenol A epoxy, cycloaliphatic epoxy, siloxane modified epoxy resin, acrylic modified epoxy resin, other organic modified epoxy resin, silicone, silicone gel, silicone rubber, silicone resin, and organic modified silicone resin.

The fluorescent composite resin substrate 1, the two conductive brackets 2, the light emitting unit 3, the two conductive lines 4 and the package material 5 are all operated on a lower plate 10, as shown.

Referring to FIG. 2, FIG. 2A, FIG. 3, and FIG. 4 as well as foregoing exploded and assembly views, in the fluorescent composite resin substrate white light LED of the present invention, the light emitting unit 3 is fixed at the fluorescent composite resin substrate 1. Thus, when applied in white light LED operations, the present invention achieves effects of emitting light through six planes as well as having high light flux and good heat dissipation. Further, the fluorescent composite resin substrate white light LED of the present invention is free from the issue of different color temperatures at front and reverse sides, and has a manufacturing process that significantly increases the production yield rate and speed.

Figure 5:
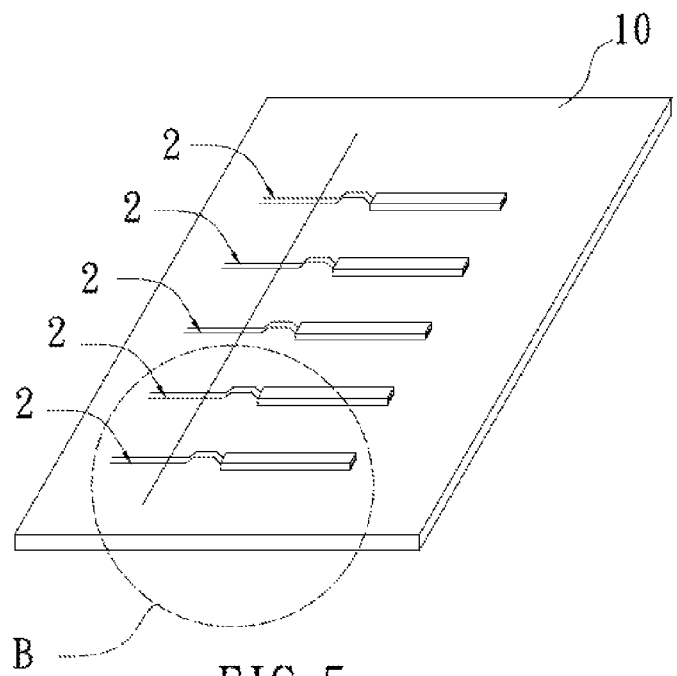
FIG. 5 is an elevational view of an appearance of the present invention.
Figure 5B:
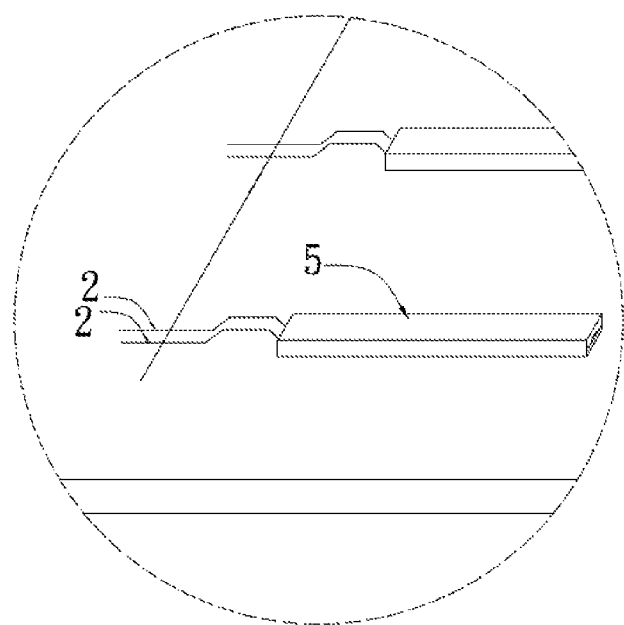
FIG. 5B is an enlarged partial view of FIG. 5.

In the manufacturing process, as the fluorescent composite resin includes a glass material, the fluorescent composite resin has rigidity similar to that of glass while being less brittle than pure glass, thereby providing both rigidity and resilience to hugely increase the production yield rate and speed, with an overall assembly as shown in FIG. 5 and FIG. 5B.

When applying an LED lamp of the present invention, power is introduced into the light emitting unit 3 through the two conductive lines 4. When the light emitting unit 3 emits light, as the fluorescent composite resin substrate 1 is capable of simultaneously generating light through six planes including front, reverse and four lateral sides, light flux is naturally higher than that of the COB technology. Further, with the fluorescent powder included in the fluorescent composite resin substrate 1, a reverse light source of the chip is allowed to directly impact the fluorescent powder to emit white light. Thus, not only light flux is similarly greater than that of the COG technology, but also the issue of different color temperatures at front and reverse sides is eliminated. Further, on the account of the fluorescent powder in the fluorescent composite resin substrate 1 and a design of polygonal or circular holes at the bottom, heat dissipation of the fluorescent composite resin substrate 1 is much more effective than that of a glass substrate, and is close to that of a conventional PCB or aluminum substrate to satisfy requirements.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A fluorescent composite resin substrate white light light emitting diode (LED), comprising:
    a fluorescent composite resin substrate, formed from a mixture through a curing reaction, the mixture forming the fluorescent composite resin substrate including composite resin, a hardening agent and a fluorescent material;
    two conductive brackets, each of the conductive brackets partially connected to the fluorescent composite resin substrate;
    a light emitting unit, disposed on a surface of the fluorescent composite resin substrate;
    two conductive lines, connected to the light emitting unit and respectively connected to the conductive brackets;
    a package material, formed from a mixture through a curing reaction, the mixture of the package material including curable resin, a hardening agent and a fluorescent material; wherein the package material covers and seals conductive lines and the light emitting unit to form a finished product of the fluorescent composite resin substrate white light LED; and
    a lower plate, for placing the fluorescent composite resin substrate, the two conductive brackets, the light emitting unit, the two conductive lines and the package material.

2. The fluorescent composite resin substrate white light LED according to claim 1, wherein the curable composite resin of the fluorescent composite resin substrate is a combination of resin and a glass filler; the resin is selected from a group consisting of epoxy, bisphenol A epoxy, cycloaliphatic epoxy, siloxane modified epoxy resin, acrylic modified epoxy resin, other organic modified epoxy resin, silicone, silicone gel, silicone rubber, silicone resin, and organic modified silicone resin.

3. The fluorescent composite resin substrate white light LED according to claim 2, wherein the glass in the curable composite resin is selected from a group consisting of common glass (SiO2) or sapphire glass (Al2O3), and is presented in form of glass powder, nanoscale glass powder, nanoscale sapphire glass powder, glass balls, glass films, glass fiber, glass fiber cloth, sapphire glass powder, sapphire glass balls or sapphire glass fiber, powder reformed from a main body of SiO2, or powder reformed from a main body of Al2O3.

4. The fluorescent composite resin substrate white light LED according to claim 1, wherein the hardening agent of the fluorescent composite resin substrate is selected from a group consisting of a hardening agent of acid anhydride, an initiator, phenolic resin or a platinum based catalyst.

5. The fluorescent composite resin substrate white light LED according to claim 1, wherein the fluorescent material of the package material is mainly a yellow fluorescent material, and having other red, green or orange fluorescent material that assists in adjusting color temperature and rendering.

6. The fluorescent composite resin substrate white light LED according to claim 5, wherein the fluorescent material is selected from a group consisting of aluminate, silicate, nitride and oxynitride fluorescent materials.

7. The fluorescent composite resin substrate white light LED according to claim 1, wherein the light emitting unit is a light emitting unit in form of a blue light LED die or a violet light LED die that emits a wavelength of below 500 nm.

8. The fluorescent composite resin substrate white light LED according to claim 1, wherein curable resin in the mixture forming the package material is selected from a group consisting of epoxy, bisphenol A epoxy, cycloaliphatic epoxy, siloxane modified epoxy resin, acrylic modified epoxy resin, other organic modified epoxy resin, silicone, silicone gel, silicone rubber, silicone resin, and organic modified silicone resin.

\* \* \* \* \*